United States Patent [19]

Barnes et al.

[11] Patent Number: 5,670,066
[45] Date of Patent: Sep. 23, 1997

[54] VACUUM PLASMA PROCESSING WHEREIN WORKPIECE POSITION IS DETECTED PRIOR TO CHUCK BEING ACTIVATED

[75] Inventors: Michael S. Barnes, San Francisco; Luo Laizhong, Fremont, both of Calif.

[73] Assignee: LAM Research Corporation, Fremont, Calif.

[21] Appl. No.: 405,676

[22] Filed: Mar. 17, 1995

[51] Int. Cl.⁶ .................................................. B23K 10/00
[52] U.S. Cl. .............................. 219/121.58; 219/121.43; 361/233; 269/903; 279/128
[58] Field of Search ........................... 219/121.43, 121.4, 219/121.58; 361/234, 230, 233, 236; 269/8, 903; 279/126, 128; 156/345

[56] References Cited

U.S. PATENT DOCUMENTS

| | | |
|---|---|---|
| 4,520,421 | 5/1985 | Sakitani et al. . |
| 4,692,836 | 9/1987 | Suzuki . |
| 5,099,571 | 3/1992 | Logan et al. . |
| 5,103,367 | 4/1992 | Horwitz et al. ......................... 361/234 |
| 5,110,438 | 5/1992 | Ohmi et al. . |
| 5,151,845 | 9/1992 | Watanabe et al. . |
| 5,160,152 | 11/1992 | Toraguchi et al. . |
| 5,213,349 | 5/1993 | Elliott . |
| 5,250,137 | 10/1993 | Arami et al. . |
| 5,255,153 | 10/1993 | Nozawa et al. . |
| 5,275,683 | 1/1994 | Arami et al. . |
| 5,325,261 | 6/1994 | Horwitz . |
| 5,404,111 | 4/1995 | Mori et al. ............................... 324/758 |
| 5,436,790 | 7/1995 | Blake et al. ............................. 361/234 |

Primary Examiner—Mark H. Paschall
Attorney, Agent, or Firm—Lowe, Price, LeBlanc & Becker

[57] ABSTRACT

A determination of whether a workpiece is properly positioned on an electrostatic chuck in a vacuum plasma processing chamber is made by measuring the capacitance across a pair of electrodes of the chuck. If the chuck is properly positioned, the workpiece is held in situ on the chuck by applying a DC voltage to the chuck. The workpiece is then processed by the plasma.

6 Claims, 2 Drawing Sheets

VACUUM PLASMA PROCESSING WHEREIN WORKPIECE POSITION IS DETECTED PRIOR TO CHUCK BEING ACTIVATED

FIELD OF INVENTION

The present invention relates generally to processing or treating workpieces with a plasma in a vacuum chamber and more particularly to a method of and apparatus for such processing wherein the workpiece position on a chuck is determined prior to (1) the chuck applying a holding force to the workpiece and (2) processing of the workpiece.

BACKGROUND ART

Plasma processing of workpieces, typically semiconductor wafers, in vacuum chambers is usually performed by electrically exciting a suitable gas pumped into a chamber having a pressure in the range of about 0.5–5.0 milliTorr. The gas is excited to a plasma state by supplying electric energy from a source outside of the chamber to the plasma by way of a transparent window in a wall of the chamber. A chuck holds the workpiece in situ while the plasma is treating the workpiece, to deposit molecules on the workpiece, or to etch the workpiece. The workpiece is placed on the chuck by an automatic positioning device having arms located in the chamber. After the workpiece is placed on the chuck by the automatic positioning device, the chuck is activated to hold the workpiece securely in place during processing by the plasma.

Electrostatic chucks, as disclosed, for example, by Logan et al., U.S. Pat. No. 5,099,571, have been extensively used for holding workpieces in situ in the vacuum chambers during plasma processing. Typically, such electrostatic chucks include first and second mutually insulated electrodes to which is applied a DC voltage for producing an electrostatic force across the electrodes. The electrostatic force is coupled to the workpiece to clamp the workpiece in place on the electrostatic chuck. In a preferred electrostatic chuck, a first electrode formed as a metal block has an annular groove in which is located a second electrode formed as a metal ring. An insulating coating separates the metal ring electrode from the metal block electrode.

A problem with prior art plasma processors in vacuum chambers is that the workpiece is sometimes not correctly placed on the chuck prior to the chuck applying a gripping force to the workpiece. If the workpiece is not properly located or placed on the chuck prior to the gripping force of the chuck being applied, the chuck and/or workpiece are susceptible to severe damage. The damage is costly to an owner of the plasma processor because of the expense associated with repair of the chuck and destruction of the workpiece, which may previously have had substantial costly operations performed on it. In addition, operation of the plasma processor is interrupted, with attendant costs associated with down time thereof.

The problem is particularly applicable to electrostatic chucks because of the substantial electrostatic forces which result from application of the DC voltage to the chuck electrodes. If the workpiece is not correctly in place at the time the DC voltage is applied to the electrodes, the workpiece may crack and cause surface damage to the chuck electrodes.

It is, accordingly, an object of the present invention to provide a new and improved method of and apparatus for operating a chuck for holding a workpiece in situ in a vacuum chamber of a plasma processor vacuum chamber.

Another object of the invention is to provide a new and improved method of and apparatus for operating an electrostatic chuck in a plasma processor vacuum chamber, such that the chuck is operated in a way to reduce the likelihood of damage to the chuck and a processed workpiece.

Another object of the invention is to provide a new and improved method of and apparatus for operating an electrostatic chuck in a plasma processor wherein the chuck is activated only when a workpiece thereon has been determined as being properly in place on the chuck.

THE INVENTION

The foregoing objects are achieved in accordance with one aspect of the invention by providing a method of treating a workpiece with a plasma in an evacuated chamber including a source of the plasma and a chuck for selectively holding the workpiece by placing the workpiece on the chuck in the evacuated chamber and then automatically detecting whether the workpiece is properly positioned on the chuck. The chuck is activated to hold the workpiece in situ in response to the automatic detecting step indicating the workpiece is properly positioned on the chuck. The workpiece held in situ on the chuck is then treated with the plasma.

The chuck is preferably an electrostatic chuck having first and second electrically insulated electrodes. Such a chuck is activated to hold the workpiece in situ by applying attractive electrostatic force to the workpiece via the electrodes. The automatic detecting step being performed by measuring the capacitance across the electrodes prior to application of the electrostatic force to the workpiece via the electrodes.

The automatic detecting step is preferably performed by determining the capacitance difference across the electrodes prior to and after the workpiece is placed on the chuck. More particularly, the automatic detecting step is performed by (1) measuring the capacitance across the electrodes immediately prior to the workpiece being placed on the chuck, (2) measuring the capacitance across the electrodes after the workpiece is placed on the chuck and before the force is applied to the workpiece, and (3) determining the difference in the measured capacitances. The electrostatic force is applied by connecting a DC voltage to the electrodes after the capacitance has been measured across the electrodes.

According to a second aspect of the invention, the objects are attained by providing an apparatus for treating a workpiece, wherein the apparatus includes a vacuum chamber, means for generating a plasma in the chamber, a chuck in the chamber for selectively holding the workpiece, and apparatus for positioning the workpiece on the chuck in the chamber. The apparatus also includes means for detecting whether the workpiece is correctly positioned on the chuck, and means for activating the chuck to hold the workpiece in situ on the chuck in response to the detecting means detecting that the chuck is correctly on the workpiece. The plasma treats the workpiece held in situ on the chuck.

The chuck preferably includes electric means for selectively applying force to the workpiece to hold the workpiece in situ. The electric means includes a pair of terminals through which current flows to cause the force to be applied. The means for detecting includes an electric measuring device connected to the terminals. In a preferred embodiment, the chuck includes a pair of mutually insulated electrodes for selectively applying electrostatic force to the workpiece and the means for detecting includes a capacitance measuring structure connected to the electrodes.

The invention is particularly advantageous for use with electrostatic chucks because of the tendency of such chucks to be seriously damaged if the workpiece is not properly positioned thereon. With such chucks it is merely necessary to measure the change in capacitance between the electrodes subsequent to the automatic positioning apparatus placing the workpiece on the chuck relative to the capacitance prior to the workpiece being placed on the chuck. Since circuitry is used for applying the DC voltage to the chuck to provide the electrostatic holding force, it is relatively simple and inexpensive to provide suitable capacitance measuring equipment across the chuck electrodes.

The above and still further objects, features and advantages of the present invention will become apparent upon consideration of the following detailed description of a specific embodiment thereof, especially when taken in conjunction with the accompanying drawings.

DESCRIPTION OF PREFERRED EMBODIMENT

Figure 1:
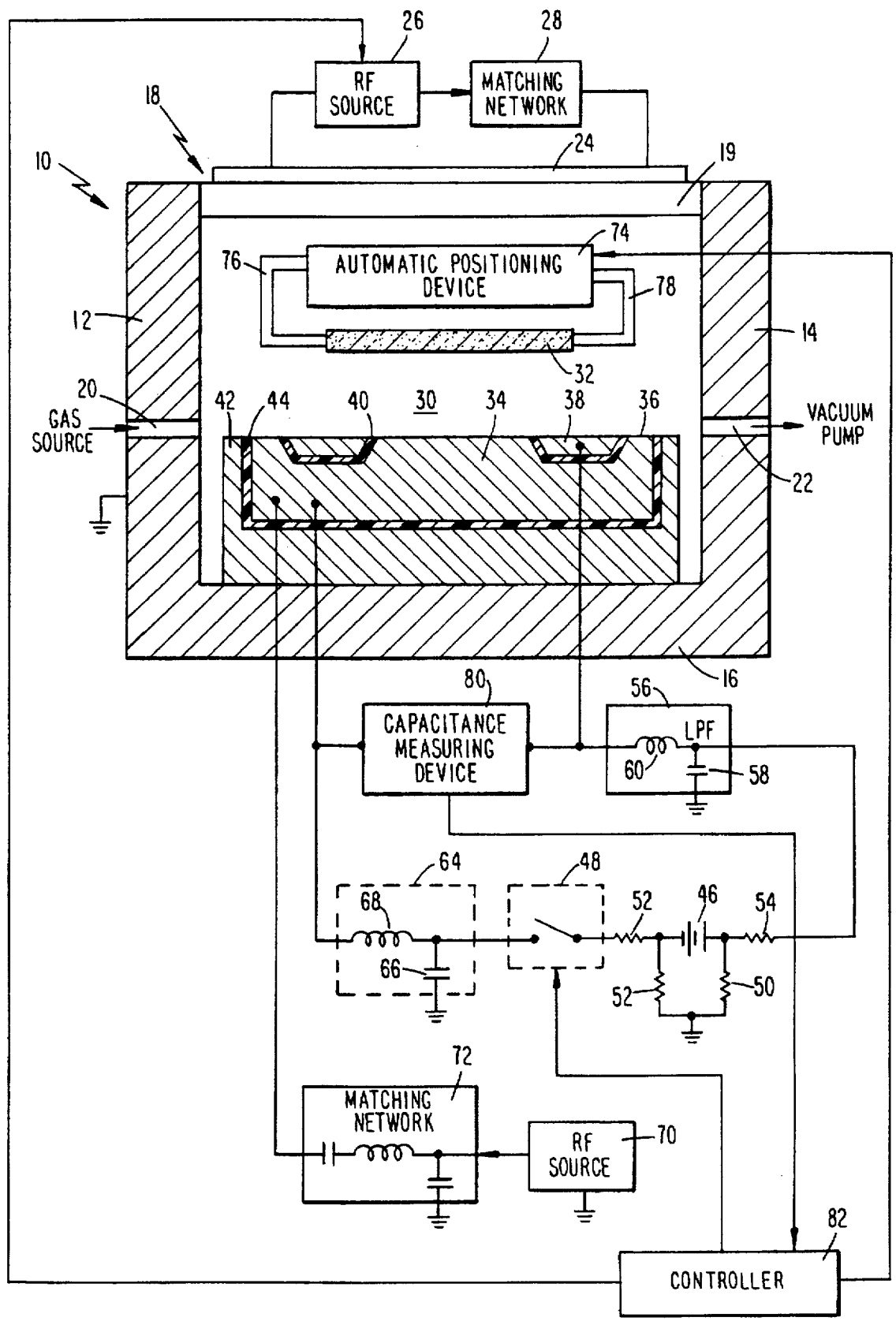
FIG. 1 is a schematic diagram of a preferred embodiment of the invention.

Reference is now made to FIG. 1 of the drawing wherein a so-called planar plasma workpiece processor is illustrated in cross section as including vacuum chamber 10, shaped as a cylinder having an electrically grounded sealed exterior cylindrical sidewall 12, formed of a metal, preferably anodized aluminum. Vacuum chamber 10 also includes rectangular metal, preferably anodized aluminum, bottom end plate 16 and circular top end plate structure 18, including dielectric window structure 19. Sealing of these exterior surfaces of chamber 10 is provided by conventional gaskets (now shown).

A suitable gas that can be excited to a plasma is supplied to the interior of chamber 10 from a gas source (not shown) via port 20 in sidewall 12. The interior of chamber 10 is maintained in a vacuum condition, at a pressure typically in the range of 0.5–5.0 milliTorr, by a vacuum pump (not shown) connected to port 22 in sidewall 12. The gas in vacuum chamber 10 is excited to a plasma condition by a suitable electric source, such as planar coil 24, mounted immediately above window 19 and excited by r.f. source 26 via matching network 28 that is resonant to the frequency of source 26.

Electrostatic chuck 30 for holding workpiece 32, typically a semiconductor wafer, includes a first electrode 34, formed as a metal block having planar top surface 36. Surface 36 includes an annular groove in which is located a second electrode of the chuck, formed as metal ring 38. Block 34 is electrically insulated from and bonded to ring 38 by electrical insulating coating 40 that covers the walls and base of the groove in block 34. Chuck 30 is fixedly secured in metal housing 42, having an upper surface with an indentation to accommodate the chuck. The walls of the indentation of housing 42 are coated with electrical insulator 44 so electrodes 34 and 38 of chuck 30 can be at different electric potentials relative to each other and the housing. Housing 42 is securely fastened to the top surface of end plate 16, which is at ground potential.

Chuck 30 is activated to hold, i.e. clamp, workpiece 32 in place by selectively applying a DC voltage between electrodes 34 and 38. The DC voltage is sufficient to produce an electrostatic force to clamp workpiece 32 in situ, between electrodes 34 and 38. To these ends, DC source 46 is selectively connected to electrodes 34 and 38 by switch 48. Opposite polarity electrodes of DC source 46 are connected to ground by shunt resistors 50 and 52, while the positive electrode of source 46 is connected to electrode 38 via series resistor 54 and low pass filter 56, including shunt capacitor 58 and series inductor 60. The negative electrode of DC source 46 is connected to electrode 34 by series resistor 62, selectively closed switch 48 and lowpass filter 64 including shunt capacitor 66 and series inductor 68. R.f. source 70 is connected to electrode 34 via matching network 72, which is resonant to the frequency of source 70.

The interior of chamber 10 includes automatic positioning device 74 having arms 76 and 78 for selectively holding opposite portions of workpiece 32. Automatic positioning device 74 activates arms 76 and 78 to position workpiece 32 on chuck 30, so the workpiece extends across planar top surface 36 of electrode 34 and contacts the planar top surface of ring electrode 38.

All of the apparatus and processes described up to this point in connection with FIG. 1 are known in the art.

In accordance with the preferred embodiment of the present invention, clamping forces are applied to workpiece 32 only after a determination has been made that the workpiece is properly in position on electrostatic chuck 30. After a determination is made that the workpiece is properly in place, switch 48 is closed, to apply a clamping force to the workpiece. Then, processing of workpiece 32 by the plasma in vacuum chamber 10 commences. Destruction of workpiece 32 and damage to chuck 30 due to improper workpiece positioning are avoided by detecting the proper position of workpiece 32 on chuck 30 prior to activation of the chuck and initiation of plasma processing. Detection of whether workpiece 32 is properly positioned on electrostatic chuck 30 is provided by measuring the capacitance between electrodes 34 and 38 prior to and subsequent to workpiece 32 being placed on the chuck. We have found that in certain instances there is a capacitance change of approximately 50 percent from the capacitance between electrodes 34 and 38 prior to placement of a semiconductor wafer workpiece 32 on the chuck relative to the capacitance across these electrodes after the workpiece has been properly placed on the chuck. If the capacitance change is not in a predetermined range the workpiece is re-positioned by device 74.

Accordingly, capacitance measuring device 80 is connected between electrodes 34 and 38. Capacitance measuring device 80 derives an output signal having a value indicative of the amount of measured capacitance between electrodes 34 and 38. The output signal of capacitance measuring device 80 is supplied as one input to controller 82, typically a properly programmed microprocessor and associated memory.

In response to capacitance measuring device 80 supplying controller 82 with signals having values associated with a capacitance change in the predetermined range, the controller is activated to close switch 48 and is then sequenced to supply a turn on signal to r.f. source 26. Thereby, workpiece 32 is clamped to chuck 30 and the gas in chamber 10 is converted to a plasma. If, however, the capacitance change monitored by device 80 is not in the predetermined range, controller 82 supplies a command signal to automatic positioning device 74, causing arms 76 and 78 to remove workpiece 32 from chuck 30. Controller 82 then causes positioning device 74 to reposition workpiece 32 on chuck 30. If positioning device 74 is unable to place workpiece 32 correctly on electrostatic chuck 30 after several attempts, an alarm is sounded and processing of the workpiece is terminated.

Figure 2:
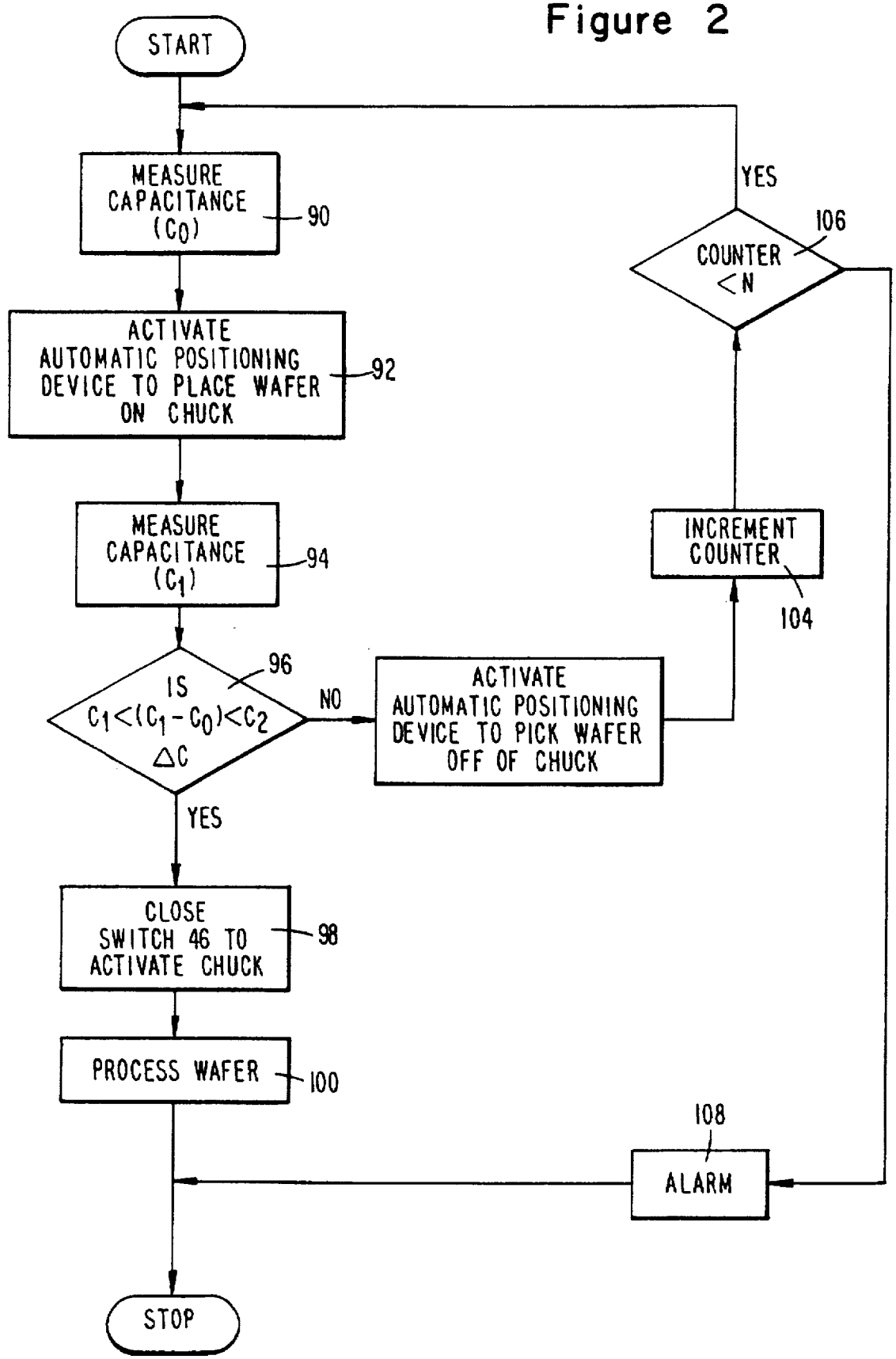
FIG. 2 is a flow diagram of how the apparatus of FIG. 1 is operated in accordance with a preferred embodiment of the invention.

A flow diagram of the operations performed by controller 82 is illustrated in FIG. 2. The first operating step 90 is to monitor the output of capacitance measuring device 80 ($C_0$) prior to workpiece 32 being placed on chuck 30. In response to step 90 being executed, the value of $C_0$ is stored in an appropriate location in the memory of controller 82. Controller 82 then advances to step 92, during which the controller activates positioning device 74, causing arms 76 and 78 to position workpiece 32 on chuck 30. Then, during step 94, controller 82 is activated to detect the amplitude of the output signal of capacitance measuring device 80 ($C_1$). The capacitance value ($C_1$) measured during step 94 is then stored in an appropriate memory location of controller 82.

The program of controller 82 then advances to step 96, during which a determination is made as to whether the absolute value of the difference between the capacitances measured during steps 94 and 90 exceeds a predetermined value, i.e., a determination is made as to whether $|C_1-C_0|$ is less or greater than $\Delta C$. If a determination is made that $|C_1-C_0|$ has a value less than $\Delta C$, wafer workpiece 32 has been found to be properly positioned on chuck 30 and the program of controller 82 advances to step 98, during which the controller supplies a signal to switch 48, to close the switch. Closure of switch 48 results in a DC voltage being coupled by DC source 46 to electrodes 34 and 38. In response to the DC voltage applied between electrodes 34 and 38 semiconductor wafer workpiece 32 is clamped, i.e., held, in situ, on electrostatic chuck 30. While switch 48 is closed, controller 82 advances to step 100, during which r.f. source 26 is activated, to cause the gas in vacuum chamber 10 to be excited to a plasma, and cause processing of semiconductor wafer workpiece 32 that is held in situ on electrostatic chuck 30. After the wafer has been treated by the plasma so it is etched on molecules or deposited thereon, the workpiece is processed in the conventional manner of the prior art.

If, however, the determination of step 96 indicates the difference between the capacitances measured across electrodes 34 and 38 subsequent to and prior to the placement of workpiece 32 on the chuck has a capacitance value outside of a predetermined range, i.e. $|C_1-C_0| \geq \Delta C$, the program of controller 82 does not advance to step 98. Instead, the program advances to step 102, during which controller 82 causes automatic positioning device 74 to activate arms 76 and 78 and lift workpiece 32 from the top surface of chuck 30. After step 102, controller 82 advances to step 104, wherein a counter in the controller is incremented by a count of one. After step 104, a determination is made during operation 106 as to whether the count in the incremented counter exceeds a predetermined value, such as four. In response to operation 106 indicating that the count in the incremented counter is four or less, the program of controller 82 returns to step 90 and the sequence is repeated. Hence, in this example five attempts are made to place workpiece 32 correctly on electrostatic chuck 30. If, however, the count in the incremented counter is determined during operation 106 to be more than four, the program advances to step 108, during which an alarm is activated. The alarm is a suitable visual and/or aural alarm to alert an operator that operation of this particular plasma processor must be investigated. After alarm step 108 has occurred, this routine of controller 82 is exited and operation of the processor of FIG. 1 is terminated until the problem which caused activation of the alarm is cured.

While there has been described and illustrated one specific embodiment of the invention, it will be clear that variations in the details of the embodiment specifically illustrated and described may be made without departing from the true spirit and scope of the invention as defined in the appended claims. For example, it is not necessary, in all instances, to measure the initial capacitance $C_0$. In some instances, the initial capacitance between electrodes 34 and 38 can be correctly presumed to be so stable that the measurement of $C_0$ is unnecessary. In addition, other types of electric sources can be used to excite the gas flowing through port 20 to a plasma state.

We claim:

1. A method of treating a workpiece with a plasma in an evacuated chamber including a source of the plasma and a chuck for selectively holding the workpiece, the chuck being an electrostatic chuck having first and second electrically insulated electrodes, comprising the steps of:

placing the workpiece on the chuck in the evacuated chamber, then automatically detecting whether the workpiece is properly positioned on the chuck, activating the chuck to hold the workpiece in situ in response to the automatic detecting step indicating the workpiece is properly positioned on the chuck, the chuck being activated to hold the workpiece in situ by applying attractive electrostatic force to the workpiece via the electrodes, the automatic detecting step being performed by measuring the capacitance across the electrodes prior to application of the electrostatic force to the workpiece via the electrodes and by determining a measure of the capacitance difference across the electrodes prior to and after the workpiece being placed on the chuck, and then treating the workpiece held in situ on the chuck with the plasma.

2. The method of claim 1 wherein the automatic detecting step is performed by measuring the capacitance across the electrodes immediately prior to the workpiece being placed on the chuck, measuring the capacitance across the electrodes after the workpiece being placed on the chuck and before the force is applied to the workpiece, and determining the difference in the measured capacitances.

3. The method of claim 2 wherein the electrostatic force is applied by connecting a DC voltage to the electrodes after the capacitance has been measured across the electrodes.

4. The method of claim 1 wherein the capacitance across the electrodes is stable and has a predetermined value so that it is not necessary to measure the capacitance across the electrodes immediately prior to the workpiece being placed on the chuck, measuring the capacitance across the electrodes after the workpiece has been placed on the chuck and before the force is applied to the workpiece, and determining the difference between the predetermined value and the measured capacitance.

5. Apparatus for treating a workpiece comprising a vacuum chamber, means for generating a plasma in the chamber, a chuck in the chamber for selectively holding the workpiece, the chuck including a pair of mutually insulated electrodes for selectively applying DC electrostatic force to the workpiece, the plasma generating means including an r.f. source connected to one of said electrodes via a network including a series blocking capacitor for preventing the flow of DC current to the r.f source, apparatus for positioning the workpiece on the chuck in the chamber, means for detecting whether the workpiece is correctly positioned on the chuck, the means for detecting including a capacitance measuring structure connected to the electrodes, and means for activating the chuck to hold the workpiece in situ on the chuck in response to the detecting means detecting that the workpiece is correctly on the chuck, the plasma treating the workpiece held in situ on the chuck.

6. The apparatus of claim 5 wherein the DC electrostatic force is derived from a DC voltage source, a pair of terminals through which current from the DC voltage source flows to the electrodes to cause the force to be applied, the capacitance measuring structure being connected to said terminals.

* * * * *